US012630020B2

(12) United States Patent
Tsuchida et al.

(10) Patent No.: US 12,630,020 B2
(45) Date of Patent: May 19, 2026

(54) BATTERY MONITORING DEVICE

(71) Applicant: TOYOTA JIDOSHA KABUSHIKI KAISHA, Toyota (JP)

(72) Inventors: Yoshiki Tsuchida, Toyota (JP); Yuuki Naruse, Kosai (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 18/945,967

(22) Filed: Nov. 13, 2024

(65) Prior Publication Data

US 2025/0326299 A1    Oct. 23, 2025

(30) Foreign Application Priority Data

Apr. 18, 2024    (JP) ................................. 2024-067595

(51) Int. Cl.
| | |
|---|---|
| *B60L 3/04* | (2006.01) |
| *B60L 58/10* | (2019.01) |
| *G01R 31/3842* | (2019.01) |
| *G01R 31/389* | (2019.01) |
| *G01R 31/396* | (2019.01) |

(52) U.S. Cl.
CPC ................. *B60L 3/04* (2013.01); *B60L 58/10* (2019.02); *G01R 31/3842* (2019.01); *G01R 31/389* (2019.01); *G01R 31/396* (2019.01); *B60L 2240/547* (2013.01)

(58) Field of Classification Search
CPC ....................................................... B60L 3/04
See application file for complete search history.

(56) References Cited

U.S. PATENT DOCUMENTS

| | | | |
|---|---|---|---|
| 7,622,897 B2 | 11/2009 | Eberhard et al. | |
| 2022/0285957 A1 | 9/2022 | Lim et al. | |
| 2022/0302719 A1 * | 9/2022 | Tenorio | H02J 7/00032 |
| 2023/0249579 A1 * | 8/2023 | Kuboyama | B60L 58/12 |
| | | | 307/10.1 |
| 2023/0327461 A1 * | 10/2023 | Ozaki | H01M 50/51 |
| | | | 320/118 |

FOREIGN PATENT DOCUMENTS

| | | |
|---|---|---|
| JP | 2006-337155 A | 12/2006 |
| JP | 2020-125950 A | 8/2020 |

* cited by examiner

*Primary Examiner* — Daniel Kessie
(74) *Attorney, Agent, or Firm* — SoraIP, Inc.

(57)    ABSTRACT

A battery monitoring device monitors an assembled battery in which sets of a plurality of battery cells connected in parallel to each other are connected in series to each other, the battery monitoring device includes an acquisition unit configured to acquire a voltage of the battery cell, a controller configured to control an upper limit value of a current flowing through the battery cell, and a detection unit configured to detect, in a case where the upper limit value is higher than a predetermined value, disconnection in the assembled battery in accordance with a comparison result between the voltage acquired by the acquisition unit and a first threshold value, in which the controller is configured to control the upper limit value such that the upper limit value is equal to or less than the predetermined value when the detection unit detects the disconnection in the assembled battery.

6 Claims, 5 Drawing Sheets

FIG. 5

BATTERY MONITORING DEVICE

CROSS-REFERENCE TO RELATED APPLICATION

This application claims priority to Japanese Patent Application No. 2024-067595 filed on Apr. 18, 2024. The disclosure of the above-identified application, including the specification, drawings, and claims, is incorporated by reference herein in its entirety.

BACKGROUND

1. Technical Field

The disclosure relates to a battery monitoring device.

2. Description of Related Art

Regarding disconnection detection in an assembled battery in which a plurality of sets of a plurality of battery cells connected in parallel to each other is connected in series to each other, for example, Japanese Unexamined Patent Application Publication No. 2020-125950 (JP 2020-125950 A) describes that the disconnection is detected based on a resistance value of a battery cell to be inspected.

SUMMARY

As a method of calculating a resistance value of a battery cell, for example, an I-V plot is used. However, since the current and voltage of the battery cell need to be collected for a certain period of time and calculated by the least square method, a time required for the disconnection detection is long, and there is a risk that the battery cell or a peripheral component thereof fails because of an overcurrent before the disconnection detection.

An aspect of the disclosure provides a battery monitoring device capable of quickly limiting a current in response to detection of disconnection in an assembled battery.

A first aspect of the disclosure relates to a battery monitoring device that monitors an assembled battery in which sets of a plurality of battery cells connected in parallel to each other are connected in series to each other. The battery monitoring device includes an acquisition unit, a controller, and a detection unit. The acquisition unit is configured to acquire a voltage of the battery cell. The controller is configured to control an upper limit value of a current flowing through the battery cell. The detection unit is configured to detect, in a case where the upper limit value is higher than a predetermined value, disconnection in the assembled battery in accordance with a comparison result between the voltage acquired by the acquisition unit and a first threshold value. In the battery monitoring device, the controller is configured to control the upper limit value such that the upper limit value is equal to or less than the predetermined value when the detection unit detects the disconnection in the assembled battery.

In the battery monitoring device, the assembled battery is configured to supply electric power to an electric motor that drives a vehicle. The controller is configured to change, in a case where the upper limit value is a first value that is higher than the predetermined value, the upper limit value to a second value that is higher than the first value in accordance with an operation of an occupant of the vehicle, and disconnect, in a case where the upper limit value is the second value, electrical connection between the electric motor and the assembled battery when the detection unit detects the disconnection in the assembled battery.

In the battery monitoring device, the controller may be configured to control, in a case where the upper limit value is the first value, the upper limit value such that the upper limit value is the predetermined value when the detection unit detects the disconnection in the assembled battery.

In the battery monitoring device, the acquisition unit may be configured to acquire the voltage and current of the battery cell. The detection unit may be configured to calculate, in a case where the upper limit value is the predetermined value, a resistance value of the battery cell from the voltage and current acquired by the acquisition unit and detect the disconnection in the assembled battery when the resistance value is equal to or higher than a second threshold value.

In the battery monitoring device, the controller may be configured to change, in a case where the upper limit value is the predetermined value, the upper limit value to the first value when the resistance value is lower than the second threshold value.

According to the aspect of the disclosure, it is possible to quickly limit a current in response to detection of disconnection in an assembled battery.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein:

FIG. 5 is a flowchart showing an example of disconnection detection processing.

DETAILED DESCRIPTION OF EMBODIMENTS

System Configuration of Vehicle

Figure 1:
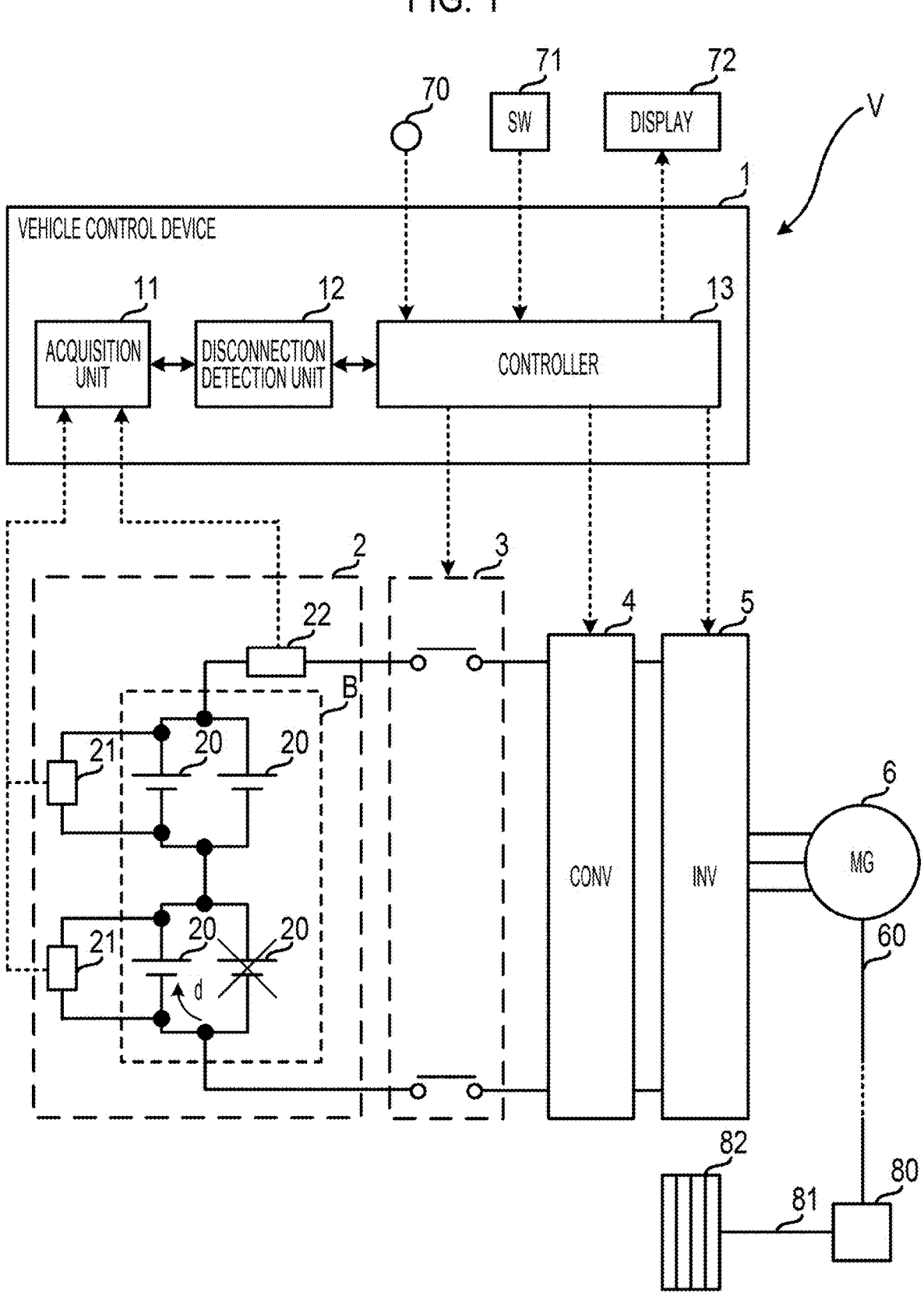
FIG. 1 is a configuration diagram showing an example of a system of a vehicle V.

FIG. 1 is a configuration diagram showing an example of a system of a vehicle V. The vehicle V includes a vehicle control device 1, a battery pack 2, a system main relay (SMR) 3, a boost converter 4, an inverter (INV) 5, an electric motor (MG) 6, an accelerator operation amount sensor 70, a launch switch (SW) 71, a display 72, a differential gear 80, a drive shaft 81, and a drive wheel 82.

The battery pack 2 supplies electric power to the electric motor 6. The battery pack 2 has a plurality of battery cells 20, such as a lithium-ion battery, a plurality of voltage sensors 21, and a current sensor 22. The battery cells 20 are connected in parallel in a set of two as an example. The voltage sensor 21 is further connected in parallel to the set of two battery cells 20 connected in parallel to each other. The voltage sensor 21 detects a voltage of each set of battery cells 20 and outputs the detected voltage to the vehicle control device 1.

The sets of two battery cells 20 connected in parallel to each other are connected in series to each other. The battery cells 20 connected in this way constitute an assembled battery B. The current sensor 22 is further connected to the battery cells 20 of sets connected in series to each other. The current sensor 22 detects a current flowing through the set of two battery cells 20 and outputs the detected current to the vehicle control device 1.

The SMR 3 is connected between the battery pack 2 and the boost converter 4. When the vehicle V travels (when Ready is on), the SMR 3 is controlled to be in an on state by the vehicle control device 1 and electrically connects the battery pack 2 and the boost converter 4. Further, while the vehicle V is parked (when Ready is off), the SMR 3 is controlled to be in an off state by the vehicle control device 1 and disconnects the electrical connection between the battery pack 2 and the boost converter 4.

The boost converter 4 boosts an output voltage of the battery pack 2 and applies the boosted voltage to the inverter 5. The boost converter 4 is a switching circuit including an insulated gate bipolar transistor (IGBT) and the like, and performs a boosting operation by being turned on and off based on a pulse width modulation (PWM) signal input from the vehicle control device 1.

The inverter 5 converts the output current of the battery pack 2 from a direct current to a three-phase alternating current and outputs the three-phase alternating current to the electric motor 6. The inverter 5 is a switching circuit including an IGBT or the like, and performs a conversion operation by being turned on and off based on a PWM signal input from the vehicle control device 1.

The electric motor 6 has a stator and a rotor (not shown), and an output shaft 60 is integrally provided at the center of the rotor. The electric motor 6 is operable as any of a motor or a generator. In a case where the electric motor 6 operates as a motor, the battery pack 2 supplies electric power to the electric motor 6 via the inverter 5. In a case where the electric motor 6 operates as a generator, the electric motor 6 charges each of the battery cells 20 of the battery pack 2 via the inverter 5.

The output shaft 60 is connected to the differential gear 80 via a power transmission mechanism (not shown). The differential gear 80 is connected to the drive shaft 81 of the drive wheel 82. As a result, the electric motor 6 can drive the drive wheel 82.

The accelerator operation amount sensor 70 detects an operation amount of an accelerator pedal (not shown) and outputs the operation amount to the vehicle control device 1. The SW 71 is used for an operation of launch start of the vehicle V. The vehicle V can start with larger torque than usual by executing the launch start. When an occupant of the vehicle V turns on the SW 71, a signal of a launch request is output from the SW 71 to the vehicle control device 1. The display 72 is, for example, a liquid crystal panel, and displays various pieces of information based on a data signal input from the vehicle control device 1.

The vehicle control device 1 is an example of a battery monitoring device. The vehicle control device 1 is a computer, such as an electronic control unit (ECU), and includes a central processing unit (CPU), a read-only memory (ROM), and a random-access memory (RAM) (not shown). The vehicle control device 1 executes drive control of the vehicle V by controlling output torque of the electric motor 6 according to a detection value of the accelerator operation amount sensor 70.

The vehicle control device 1 includes an acquisition unit 11, a disconnection detection unit 12, and a controller 13, for example, as functions of software that drives a CPU. The acquisition unit 11, the disconnection detection unit 12, and the controller 13 may be implemented by hardware, such as an integrated circuit (IC).

The acquisition unit 11 acquires the voltage of each battery cell 20 from the voltage sensors 21. The acquisition unit 11 acquires the current flowing through the set of two battery cells 20 from the current sensor 22.

The disconnection detection unit 12 is an example of a detection unit. The disconnection detection unit 12 detects disconnection in the assembled battery B. Examples of the disconnection include a case where one battery cell of the set of two battery cells 20 connected in parallel to each other is disconnected (refer to a mark x). In this case, as indicated by a reference sign d, the current of the assembled battery B is concentrated in the other battery cell 20 of the set of two battery cells 20.

The disconnection detection is performed for each set of two battery cells 20 connected in parallel to each other in the assembled battery B. The disconnection detection unit 12 detects the disconnection by a method according to a traveling mode of the vehicle V. As the traveling mode, there are a normal mode, a launch mode, and a limit mode as described below, and an upper limit value of the current flowing through each battery cell 20 is different for each mode.

In the limit mode, the disconnection detection unit 12 calculates a resistance value of the battery cell 20 from the voltage and current acquired by the acquisition unit 11, and detects the disconnection in the assembled battery B when the resistance value is equal to or higher than a threshold value. In the limit mode, since the upper limit value of the current flowing through the assembled battery B is lower than that in the normal mode and the launch mode, the time required for the battery cell 20 to fail when the current is concentrated in the battery cell 20 because of the disconnection as described above is longer than that in the normal mode and the launch mode. Therefore, the disconnection detection unit 12 can reliably detect the disconnection before the failure of the battery cell 20 even in a case where the resistance value is calculated by the least square method by executing an I-V plot of the voltage and the current for a predetermined period, for example.

Meanwhile, in the normal mode and the launch mode, since the upper limit value of the current flowing through the assembled battery B is larger than that in the limit mode, the time required for the battery cell 20 to fail when the disconnection occurs is shorter than that in the limit mode, and the disconnection detection based on the resistance value is difficult. Therefore, in the normal mode and the launch mode, the disconnection detection unit 12 detects the disconnection in the assembled battery B in accordance with a comparison result between the voltage acquired by the acquisition unit 11 and a threshold value. When the current is concentrated in the battery cell 20 because of the disconnection as described above, the voltage of the battery cell 20 increases. Therefore, the disconnection detection unit 12 can quickly detect the disconnection, for example, in a case where a time change amount of the voltage of the voltage sensor 21 is equal to or higher than the threshold value.

The controller 13 specifies the output torque of the electric motor 6 according to the detection value of the accelerator operation amount sensor 70, and controls the boost converter 4 and the inverter 5 according to the output torque. The controller 13 controls the traveling mode (the normal mode, the launch mode, and the limit mode) of the vehicle V. The controller 13 controls the traveling mode to the launch mode in a case where the SW 71 is turned on by the occupant in the normal mode. In addition, the controller 13 controls the traveling mode to the limit mode in a case where the disconnection detection unit 12 detects the disconnection in the normal mode or the launch mode.

Control of Upper Limit Value of Current

The controller 13 controls the upper limit value of the current flowing through the battery cell 20 according to the traveling mode. The controller 13 controls the upper limit value of the current in the limit mode such that the upper limit value is IL, controls the upper limit value of the current in the normal mode such that the upper limit value is IM, and controls the upper limit value of the current in the launch mode such that the upper limit value is IH. Here, a relationship of IL<IM<IH is satisfied. The upper limit value is controlled, for example, by setting of Win and Wout.

Figure 2:
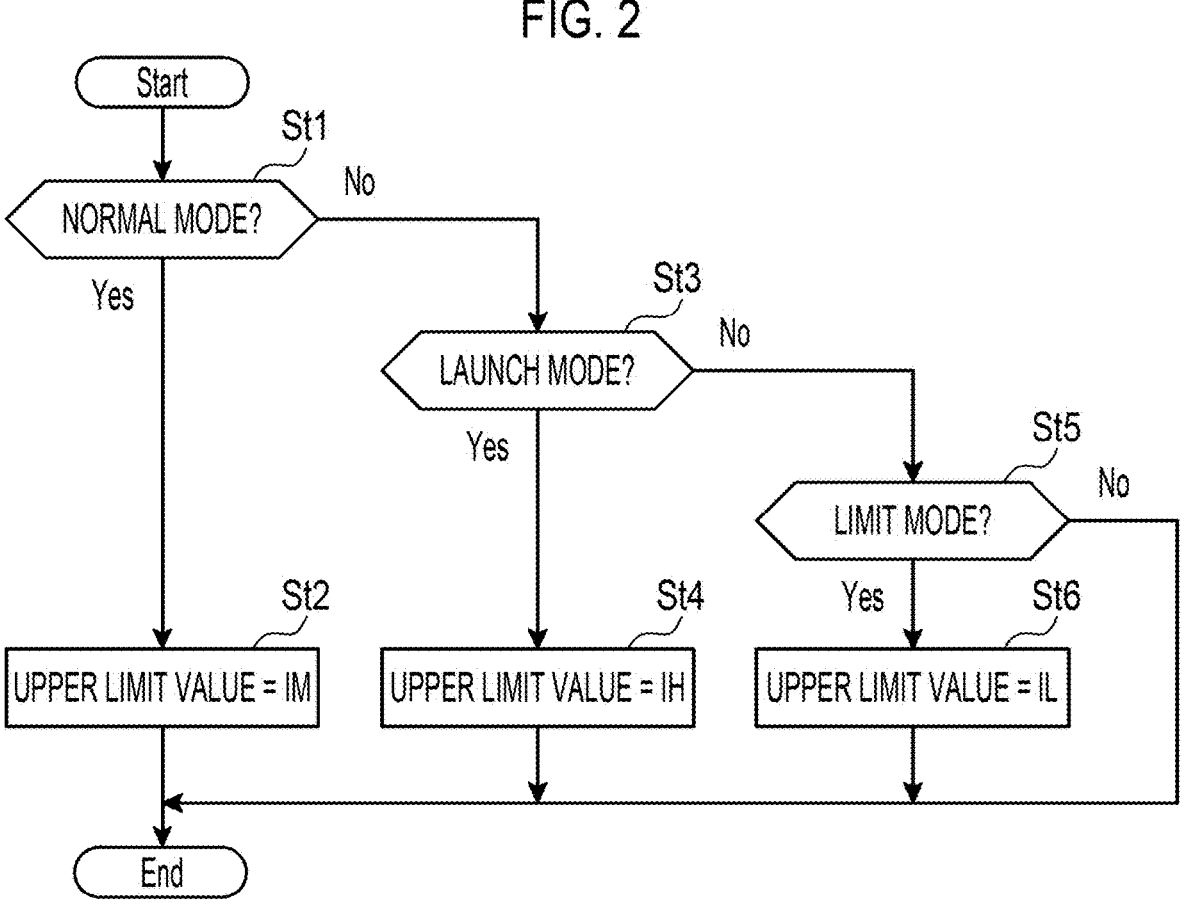
FIG. 2 is a flowchart showing an example of control processing of an upper limit value of a current.

FIG. 2 is a flowchart showing an example of control processing of the upper limit value of the current. The present processing is executed, for example, at a certain cycle.

First, the controller 13 determines whether or not the traveling mode is the normal mode (step St1). The normal mode is used for normal traveling in a case where there is no possibility of disconnection in the assembled battery B. In a case where the traveling mode is the normal mode (Yes in step St1), the controller 13 controls the upper limit value such that the upper limit value is IM (step St2).

In a case where the traveling mode is not the normal mode (No in step St1), the controller 13 determines whether or not the traveling mode is the launch mode (step St3). The launch mode is used for traveling of the vehicle V at output torque higher than that in the normal mode. In a case where the traveling mode is the launch mode (Yes in step St3), the controller 13 controls the upper limit value such that the upper limit value is IH (step St4).

In a case where the traveling mode is not the launch mode (No in step St3), the controller 13 determines whether or not the traveling mode is the limit mode (step St5). The limit mode is used for traveling in a case where there is a possibility of disconnection in the assembled battery B. In a case where the traveling mode is the limit mode (Yes in step St5), the controller 13 controls the upper limit value such that the upper limit value is IL (step St6). In addition, in a case where the traveling mode is not the limit mode (No in step St5), the present processing is ended. In this way, the control processing of the upper limit value of the current is executed.

Required Time for Failure of Battery Cell

Figure 3:
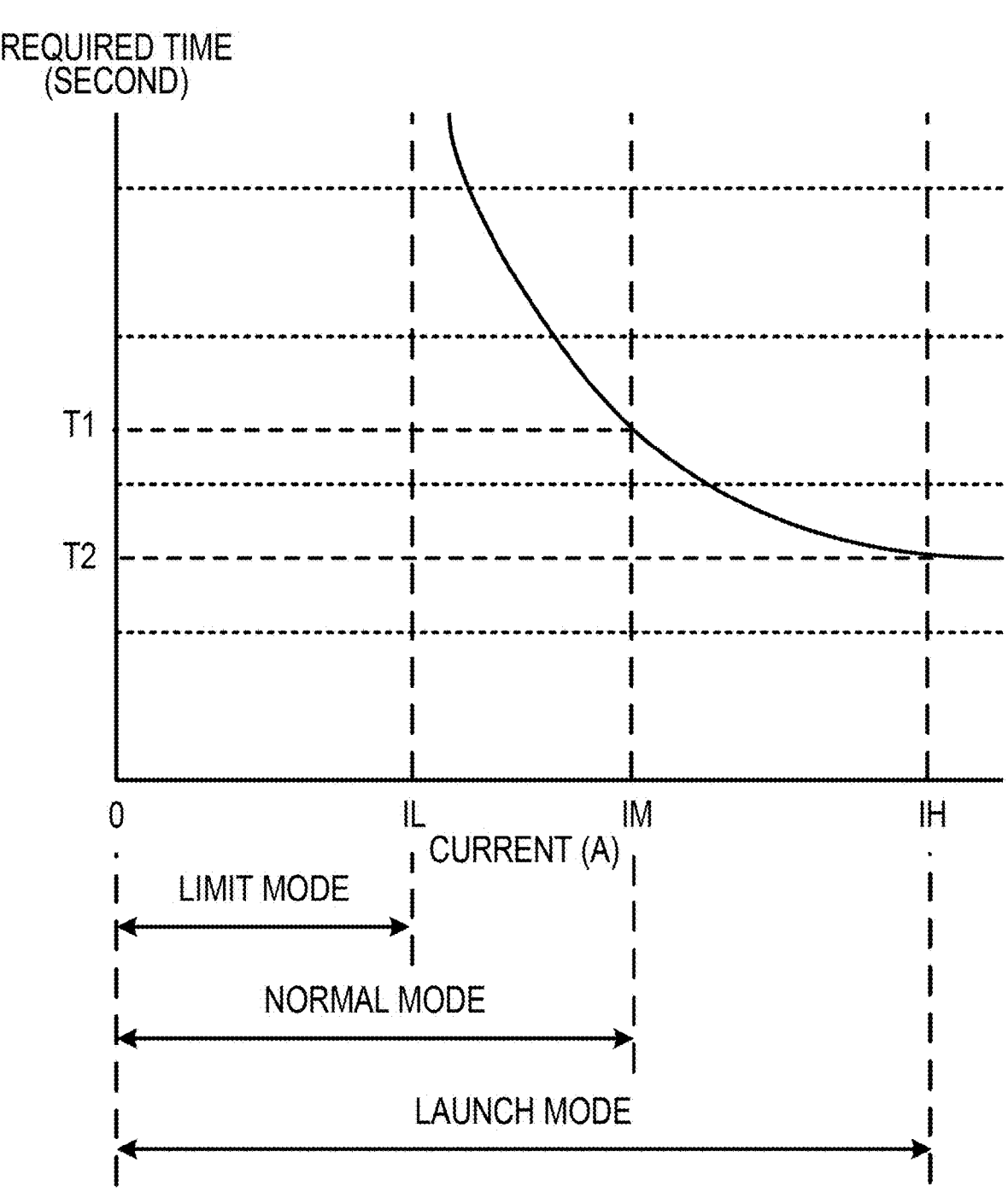
FIG. 3 is a graph showing an example of a time required for a failure of a battery cell when disconnection occurs.

FIG. 3 is a graph showing an example of a time required for the failure of the battery cell 20 at the time of the disconnection. A horizontal axis indicates a value of the current (A) flowing through the battery cell 20, and a vertical axis indicates the time (second) required for the battery cell 20 to fail because of an overcurrent in a case where the disconnection occurs. The vertical axis scale is shown in logarithm.

The usage range of the current is 0 to IL in the limit mode, 0 to IM in the normal mode, and 0 to IH in the launch mode. The time required for the failure is shorter as the current is larger. Here, the required time in a case where the current is within the range of 0 to IL is much larger as compared with the required time in a case where the current is within the other ranges. Therefore, in the limit mode (usage range: 0 to IL), the influence of the required time on the disconnection detection can be substantially ignored.

Meanwhile, in the normal mode (usage range: 0 to IM), the required time is a minimum value T1 at the upper limit value IM of the current, and in the launch mode (usage range: 0 to IH), the required time is a minimum value T2 at the upper limit value IH of the current. Here, a relationship of T1>T2 is satisfied between the minimum values T1, T2.

As described above, in the normal mode and the launch mode, since the upper limit values IM, IH of the current are larger than the upper limit value IL in the limit mode, the time required for the failure of the battery cell 20 is short. The controller 13 compares the voltage of the battery cell 20 with the threshold value, so that the time required for the disconnection detection can shortened, and the possibility of the disconnection can be determined before the failure of the battery cell 20, although the detection accuracy of the disconnection is reduced as compared with the detection based on the resistance value.

In the limit mode, since the upper limit value IL of the current is lower than the upper limit values IM, IH in the normal mode and the launch mode, the time required for the failure of the battery cell 20 is very long. Therefore, the controller 13 detects the disconnection from the resistance value of the battery cell 20, whereby it is possible to more reliably detect the disconnection although the time required for the disconnection detection is longer than that for the detection based on the voltage. The upper limit value IL is an example of a predetermined value, the upper limit value IM is an example of a first value, and the upper limit value IH is an example of a second value.

Transition Processing to Launch Mode

Figure 4:
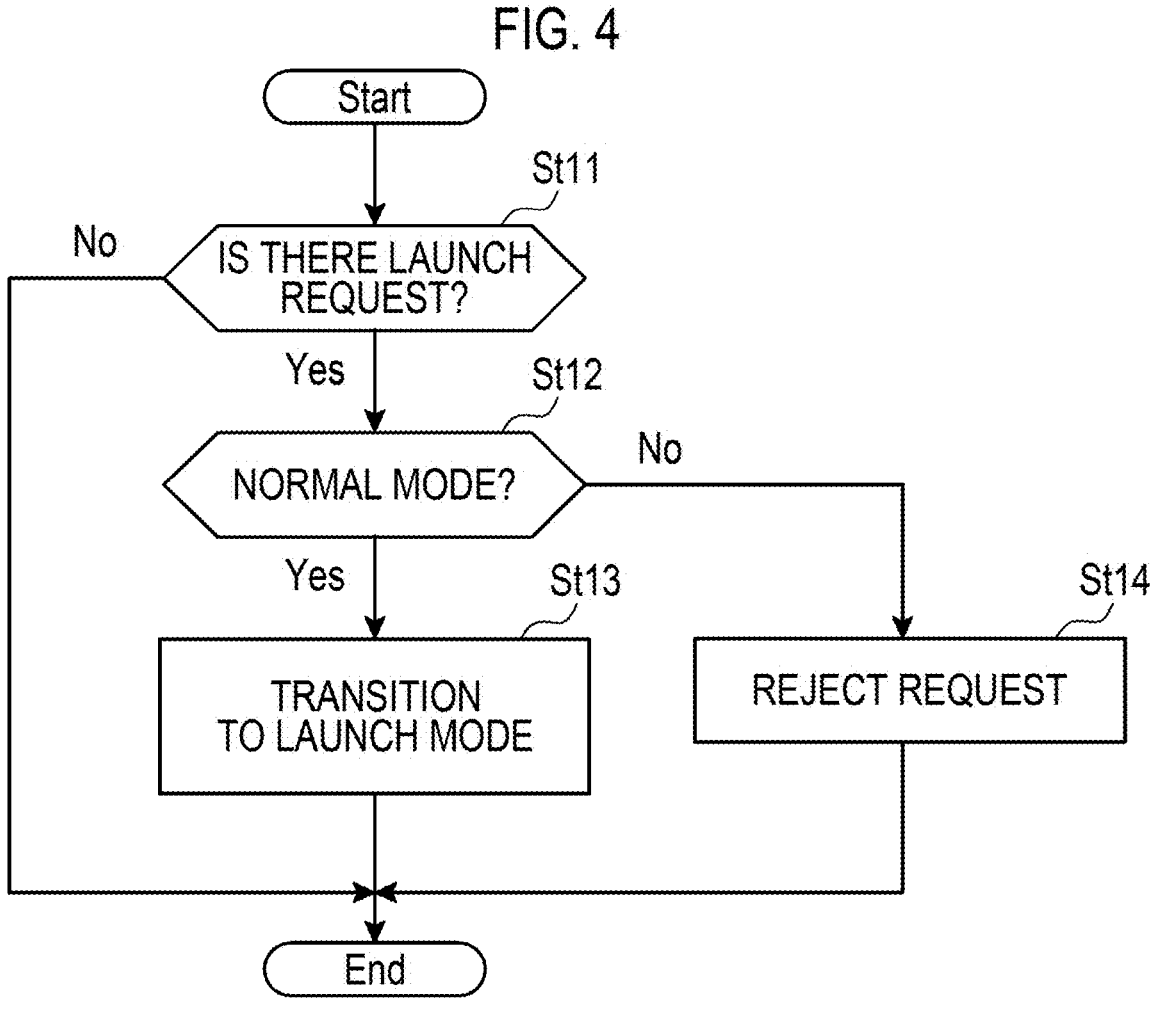
FIG. 4 is a flowchart showing an example of transition processing to a launch mode.

FIG. 4 is a flowchart showing an example of transition processing to the launch mode. The present processing is executed, for example, at a certain cycle.

First, the controller 13 determines whether or not there is the launch request (step St11). The launch request is issued in a case where the occupant operates the SW 71 to turn on the SW 71, as described above. In a case where there is no launch request (No in step St11), the present processing is ended.

In a case where there is the launch request (Yes in step St11), the controller 13 determines whether or not the traveling mode of the vehicle V is the normal mode (step St12). In a case where the traveling mode is the normal mode (Yes in step St12), the controller 13 causes the traveling mode to transition from the normal mode to the launch mode (step St13). In addition, in a case where the traveling mode is the launch mode or the limit mode (No in step St12), the launch request is rejected (step St14). In this case, the traveling mode is not changed. In this way, the transition processing to the launch mode is executed.

Disconnection Detection Processing

Figure 5:
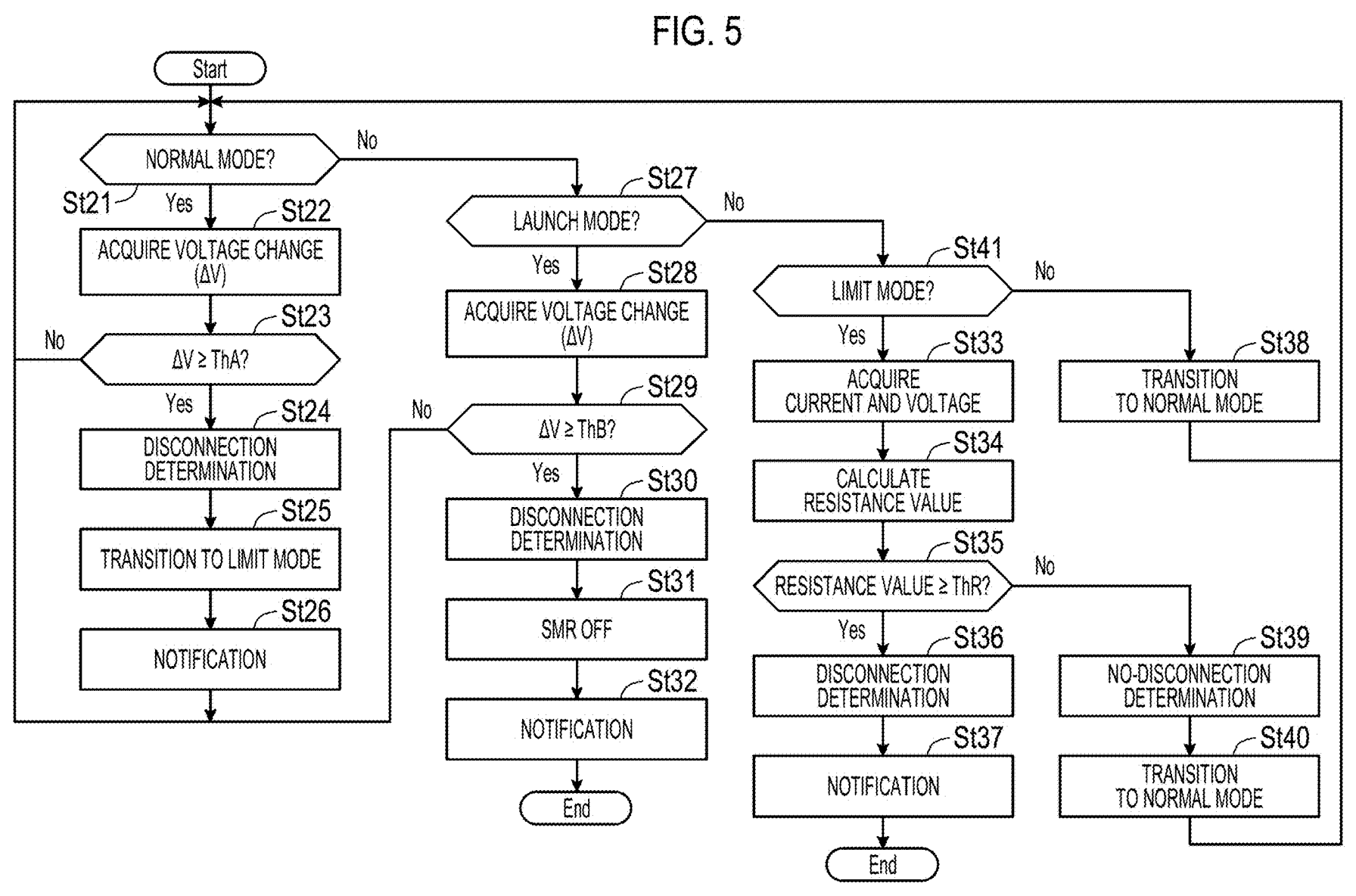

FIG. 5 is a flowchart showing an example of disconnection detection processing. The present processing is executed simultaneously in parallel with the transition processing to the launch mode.

The disconnection detection unit 12 determines whether or not the traveling mode is the normal mode (step St21). In a case where the traveling mode is the normal mode (Yes in step St21), the disconnection detection unit 12 acquires a time change amount ΔV of the voltage of the battery cell 20 (step St22). At this time, the disconnection detection unit 12 calculates, for example, a difference between two voltage values continuously acquired by the acquisition unit 11 (=the latest voltage value—the previous voltage value) as the time change amount ΔV.

Next, the disconnection detection unit 12 compares the time change amount ΔV of the voltage with a threshold value ThA (step St23). In a case where a relationship of ΔV<ThA is satisfied (No in step St23), the disconnection detection unit 12 determines that there is no possibility of disconnection, and executes each of step St21 and the subsequent steps again.

In a case where a relationship of $\Delta V \geq$ ThA is satisfied (Yes in step St23), the disconnection detection unit 12 determines that there is a possibility of disconnection (step St24). Here, the threshold value ThA is an example of a first threshold value, and is appropriately specified based on, for example, the usage range of the current in the normal mode and electrical characteristics of the battery cell 20.

As described above, in the normal mode, the disconnection detection unit 12 detects the disconnection in accordance with a comparison result between the time change amount $\Delta V$ of the voltage and the threshold value ThA. Therefore, the time required for the disconnection detection can be shortened as compared with a case where the disconnection is detected by the resistance value using a method such as the I-V plot.

Next, the controller 13 causes the traveling mode to transition from the normal mode to the limit mode (step St25). As a result, the controller 13 changes the upper limit value of the current flowing through the battery cell 20 from IM to IL. Therefore, in a case where there is a possibility of disconnection, the current of the battery cell 20 is limited to the usage range having the lowest current value among the usage ranges of the currents of the three modes, and thus the failure of the battery cell 20 because of an overcurrent is reduced.

Next, the controller 13 outputs message information for notifying the occupant that the traveling mode has transitioned to the limit mode to the display 72 (step St26). Thereafter, each of step St21 and the subsequent steps is executed again.

In addition, in a case where the traveling mode is not the normal mode (No in step St21), the disconnection detection unit 12 determines whether or not the traveling mode is the launch mode (step St27). In a case where the traveling mode is the launch mode (Yes in step St27), the disconnection detection unit 12 acquires the time change amount $\Delta V$ of the voltage of the battery cell 20 in the same manner as in step St22 (step St28).

Next, the disconnection detection unit 12 compares the time change amount $\Delta V$ of the voltage with a threshold value ThB (step St29). In a case where a relationship of $\Delta V <$ ThB is satisfied (No in step St29), the disconnection detection unit 12 determines that there is no possibility of disconnection, and executes each of step St21 and the subsequent steps again.

In a case where a relationship of $\Delta V \geq$ ThB is satisfied (Yes in step St29), the disconnection detection unit 12 determines that there is a possibility of disconnection (step St30). Here, the threshold value ThB is an example of the first threshold value, and is appropriately specified based on, for example, the usage range of the current in the launch mode and electrical characteristics of the battery cell 20. As described above, in the launch mode, since a larger current flows through the battery cell 20 than in the normal mode, the time required for the failure is short. Therefore, the threshold value ThB may be set to a value smaller than the threshold value ThA such that disconnection is detected more quickly than in the normal mode.

As described above, in the launch mode, the disconnection detection unit 12 detects the disconnection in accordance with the comparison result between the time change amount $\Delta V$ of the voltage and the threshold value ThB.

Therefore, the time required for the disconnection detection can be shortened in the same manner as in the case of the normal mode.

Next, the controller 13 turns off the SMR 3 (step St31). As a result, the controller 13 can disconnect the electrical connection between the electric motor 6 and the assembled battery B. Therefore, by quickly limiting the current of the battery cell 20 to 0 (A), it is possible to effectively protect the battery cell 20 from the large current in the launch mode.

Next, the controller 13 outputs message information for notifying the occupant that the SMR 3 has been turned off to the display 72 (step St32). Thereafter, the present processing is ended.

As described above, in the normal mode and the launch mode in which the upper limit value of the current flowing through the battery cell 20 is larger than IL, the disconnection detection unit 12 detects the disconnection in accordance with the comparison result between the time change amount $\Delta V$ of the voltage of the battery cell 20 and the threshold value ThB. In addition, the controller 13 controls the upper limit value of the current such that the upper limit value is equal to or less than IL when the disconnection detection unit 12 detects the disconnection. Therefore, the vehicle control device 1 can quickly limit the current in response to the detection of the disconnection of the assembled battery B.

In addition, in a case where the traveling mode is not the launch mode (No in step St27), the disconnection detection unit 12 determines whether or not the traveling mode is the limit mode (step St41). In a case where the traveling mode is not the limit mode (No in step St41), the controller 13 causes the traveling mode to transition to the normal mode (step St38). Therefore, for example, in a case where the traveling mode is not set as in an initial state and is not any of the three modes described above, the normal mode is set. Thereafter, each of step St21 and the subsequent steps is executed again.

In a case where the traveling mode is the limit mode (Yes in step St41), the disconnection detection unit 12 acquires the current and voltage of the battery cell 20 (step St33). At this time, the disconnection detection unit 12 collects the current and voltage acquired by the acquisition unit 11 for a certain period of time to perform the I-V plot. Next, the disconnection detection unit 12 calculates the resistance value of the battery cell 20 from an inclination of an approximate straight line obtained in the I-V plot (step St34).

Next, the disconnection detection unit 12 compares the resistance value with a threshold value ThR (step St35). In a case where a relationship of the resistance value $\geq$ ThR is satisfied (Yes in step St35), the disconnection detection unit 12 determines that the disconnection has occurred (step St36). Here, the threshold value ThR is an example of a second threshold value, and is appropriately specified based on, for example, the usage range of the current in the limit mode and the electrical characteristics of the battery cell 20 in the limit mode.

As described above, the disconnection detection unit 12 detects the disconnection in a case where the resistance value is equal to or higher than the threshold value ThR in the limit mode in which the upper limit value is IL. Therefore, it is possible to reliably detect disconnection as compared with the normal mode and the launch mode.

Next, the controller 13 outputs message information for notifying the occupant that the traveling mode has transitioned to the limit mode to the display 72 (step St37). Thereafter, the present processing is ended.

In a case where the relationship of the resistance value<ThR is satisfied (No in step St35), the disconnection detection unit 12 determines that the disconnection has not occurred (step St39). Next, the controller 13 causes the traveling mode to transition from the limit mode to the normal mode (step St40). As a result, the controller 13 changes the upper limit value of the current of the battery cell 20 from IL to IH. Therefore, in a case where the determination is made that the disconnection has not occurred, it is possible to loosen the limit of the current of the battery cell 20. Thereafter, each of step St21 and the subsequent steps is executed again. In this way, the disconnection detection processing is executed.

The disconnection detection processing is executed for each set of two battery cells 20 connected in parallel to each other. In a case where the disconnection is detected in any one set, the processing at the time of the disconnection detection for the set is executed with priority as compared with the processing of the other set. For example, in a case where the condition of Step St23 is satisfied and the possibility of disconnection is determined in any one set (Step St24), transition of the traveling mode to the limit mode is performed in processing of all sets (Step St25).

In the present example, the disconnection detection unit 12 compares the current of the battery cell 20 with the threshold values ThA, ThB, but may compare the current with an estimated value of the current in a case where there is no disconnection. In this case, the estimated value is an example of the first threshold value. The estimated value is obtained from, for example, a numerical simulation result obtained by modeling the assembled battery B in advance.

The embodiments described above are examples of preferred embodiments of the disclosure. Note that the disclosure is not limited to the embodiments and various modifications can be made without departing from the gist of the disclosure.

What is claimed is:

1. A battery monitoring system configured to monitor an assembled battery mounted on a vehicle, the assembled battery including sets of a plurality of battery cells connected in series to each other, the plurality of battery cells being connected in parallel to each other, the battery monitoring system comprising:

a voltage sensor connected in parallel to the battery cell;
a current sensor connected in series with the battery cell;
a display configured to display information; and
a processor configured to
control an upper limit value of a current flowing through the battery cell in accordance with a travelling mode of the vehicle,
determine whether the upper limit value of the current flowing through the battery cell is larger than a first threshold,
in a case where the upper limit value of the current flowing through the battery cell is larger than the first threshold, determine whether a change in the voltage of the battery cell during a predetermined time period is equal to or larger a second threshold,
in a case where the change in the voltage of the battery cell during the predetermined time period is equal to or larger than the second threshold, set the upper limit value of the current flowing through the battery cell to be equal to or less than the first threshold, in a case where the upper limit value of the current flowing through the battery cell is equal to or less than the first threshold, acquire a current value and a voltage value of the battery cell from the current sensor and the voltage sensor,
calculate a resistance value of the battery cell based on the acquired current value and the acquired voltage value,
determine whether the resistance value is equal to or larger than a third threshold, and
in a case where the resistance value is equal to or larger than a third threshold, display a notification on the display.

2. The battery monitoring system according to claim 1, wherein:
the assembled battery is configured to supply electric power to an electric motor that drives the vehicle; and
the processor is configured to
determine whether the upper limit value of the current flowing through the battery cell is larger than a fourth threshold that is larger than the first threshold,
in a case where the upper limit value of the current flowing through the battery cell is larger than the fourth threshold, determine whether the change in the voltage of the battery cell during the predetermined time period is equal to or larger than a fifth threshold, and
in a case where the change in the voltage of the battery cell during the predetermined time period is equal to or larger than the fifth threshold, turn a system main relay off to disconnect electrical connection between the electric motor and the assembled battery.

3. The battery monitoring system according to claim 1, wherein the processor is configured to set the upper limit value of the current flowing through the battery cell to be equal to the first threshold in a case where the change in the voltage of the battery cell during the predetermined time period is equal to or larger than the second threshold.

4. The battery monitoring system according to claim 2, wherein the fifth threshold is smaller than the second threshold.

5. The battery monitoring system according to claim 2, wherein in a case where the system main relay is turned off, the processor is configured to display a message on the display that notifies a passenger of the vehicle that the system main relay is turned off.

6. The battery monitoring system according to claim 2, wherein the travelling mode of the vehicle includes a first mode, a second mode, and a third mode,
in a case where the vehicle is in the first mode, the processor is configured to set the upper limit value of the current flowing through the battery cell to be larger than the first threshold, and to be equal to or less than the fourth threshold,
in a case where the vehicle is in the second mode, the processor is configured to set the upper limit value of the current flowing through the battery cell to be larger than the fourth threshold, and
in a case where the vehicle is in the third mode, the processor is configured to set the upper limit value of the current flowing through the battery cell to be equal to or less than the first threshold.

* * * * *